(12) United States Patent
Wakefield

(10) Patent No.: US 6,265,844 B1
(45) Date of Patent: Jul. 24, 2001

(54) BATTERY PACK WITH PHOTO MEANS FOR ENABLING INTEGRAL CIRCUITRY

(75) Inventor: Ivan N. Wakefield, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/109,442

(22) Filed: Jul. 2, 1998

(51) Int. Cl.[7] ...................................................... H02J 7/00
(52) U.S. Cl. ................................................................. 320/107
(58) Field of Search ...................................... 320/107, 114, 320/DIG. 18; 429/90; 439/347

(56) References Cited

U.S. PATENT DOCUMENTS 5,206,097 * 4/1993 Burns et al. ........................... 320/114
6,002,236 * 12/1999 Trant et al. ........................... 320/114

* cited by examiner

*Primary Examiner*—Peter S. Wong
*Assistant Examiner*—Pia Tibbits
(74) *Attorney, Agent, or Firm*—Wood, Phillips, VanSanten, Clark & Mortimer

(57) ABSTRACT

A battery pack provides electrical power to an electrical or electronic device. The battery pack includes a case removably receivable on an electrical or electronic device. A battery cell is disposed in the case. Battery terminals are mounted to the case and are operatively connected to the cell for mating with corresponding terminals on the device, in use, to connect the cell to the device. A photodetector is mounted to the case for receiving a wireless control signal. A control circuit is operatively connected to the photodetector and the battery cell for controlling operation of the battery pack responsive to the wireless control signal.

19 Claims, 2 Drawing Sheets

BATTERY PACK WITH PHOTO MEANS FOR ENABLING INTEGRAL CIRCUITRY

FIELD OF THE INVENTION

This invention relates to portable electronic devices and, more particularly, to a battery pack for providing electrical power to a portable electronic device including a photodetector for enabling integral circuitry.

BACKGROUND OF THE INVENTION

Portable electronic devices such as, for example, mobile cellular telephones, include a removable battery pack providing electrical power. Such battery packs consist of more than simply a case and battery cells. Indeed, such battery packs may include built-in microprocessor controllers and/or memory circuits used for controlling the charging and discharging of the battery cells.

As battery capacity increases and various battery chemistries require circuitry for safety and performance, the need for better communication with the battery, control of the battery, and reduced power drain internal to the battery pack increases. Some of these features have been addressed with prior battery pack designs. These designs utilize numerous electrical and mechanical contacts which connect to the electronic device or a separate charger. Prior solutions were effective in larger products but become more difficult to implement as the electronic devices and battery packs shrink in size. Also, these functions are not operative when the battery pack is separated from the electronic device. As a result, a charger or device cannot interrogate a battery for its state of charge and warn the user if the battery has been sitting unused for an extended period if it is not connected to the charger or electronic device.

The present invention is directed to overcome one or more of the problems discussed above in a novel and simpler manner.

SUMMARY OF THE INVENTION

In accordance with the invention there is provided a battery pack with a photodetector for enabling integral circuitry.

Broadly, there is disclosed herein a battery pack for providing electrical power to an electrical or electronic device. The battery pack includes a case removably receivable on an electrical or electronic device. A battery cell is disposed in the case. Battery terminals are mounted to the case and are operatively connected to the cell for mating with corresponding terminals on the device, in use, to connect the cell to the device. A photodetector is mounted to the case for receiving a wireless control signal. A control circuit is operatively connected to the photodetector and the battery cell for controlling operation of the battery pack responsive to the wireless control signal.

It is a feature of the invention that a switch is connected between the battery cell and the terminals for selectively connecting the cell to the terminals. The control circuit controls operation of the switch to selectively enable or disable the battery pack. A bypass circuit can be connected across the switch to supply a low current level to the terminals.

It is a further feature of the invention to provide an operating element housed in the case and the control circuit controls operation of the operating element. The operating element may comprise an indicator light, a vibrator, a display displaying information about the battery pack and/or a photo emitter for transmitting a wireless signal regarding information about the battery pack.

It is another feature of the invention that the photodetector decodes the wireless control signal.

More particularly, in accordance with the invention the portable electronic device or charger can control the functions of a battery pack, including its internal circuitry. Charging and discharging currents can be regulated by externally controlling the internal battery pack circuitry, simplifying charger circuitry. The battery pack can be turned off, or put in a limited power output mode, as might be desirable for a lithium-ion battery, so that excessive current draw could be prevented when the battery is removed from the phone or if a fault is detected in the phone or battery. Circuitry in the battery pack can be powered on or off by an analog or digital signal, or a serial signal could put the battery pack in a pre-defined mode to perform a function or provide information. For example, the battery could be requested to provide its chemical type or size, or data about capacity, cycles, state of discharge or temperature. It could also control some operating element in the battery pack such as a vibrator, a separate infrared link, or a latching or locking mechanism.

Further features and advantages of the invention will be readily apparent from the specification and from the drawings.

DETAILED DESCRIPTION OF THE INVENTION

Figure 1:
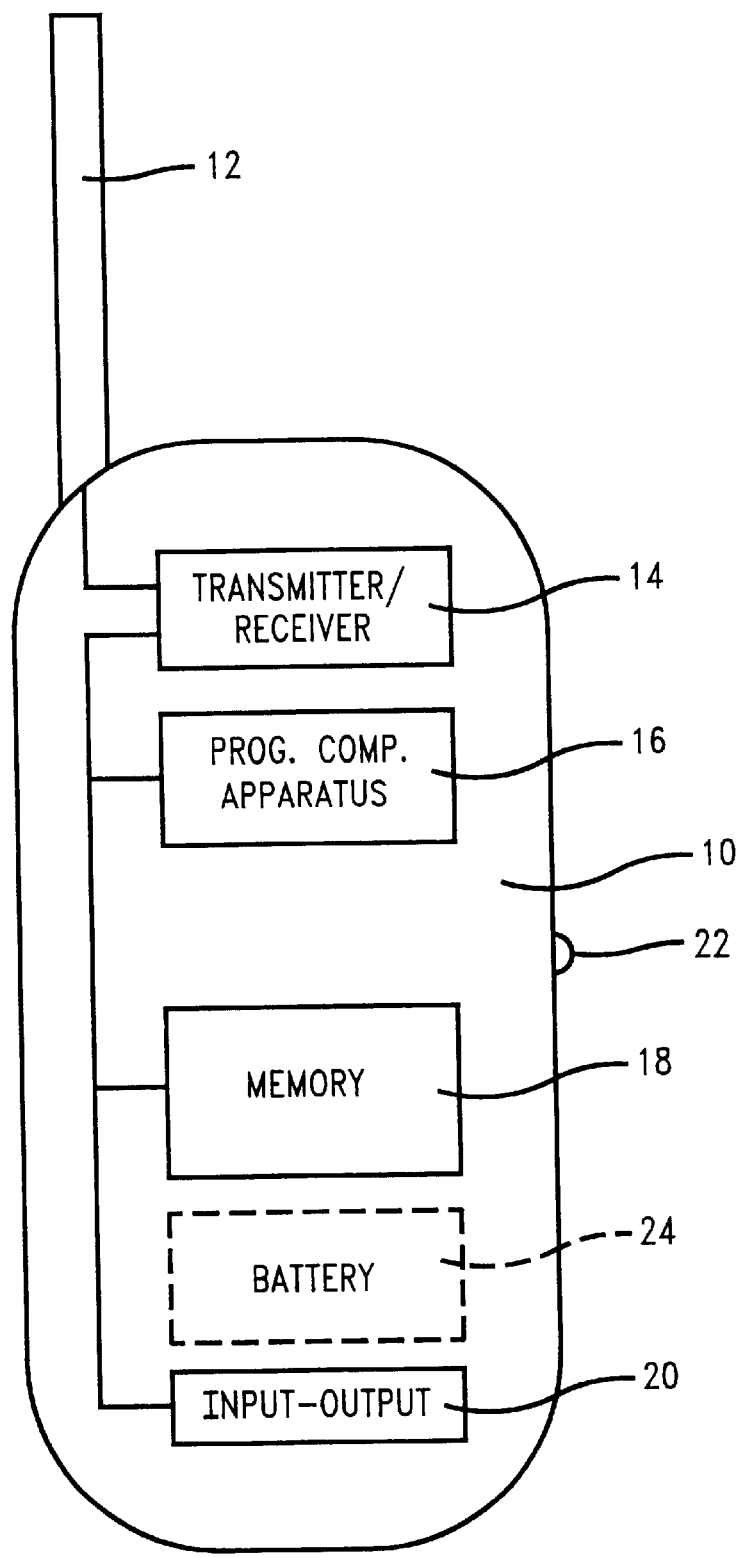
FIG. 1 illustrates a mobile telephone and related circuity in block diagram form including a battery pack according to the invention.

FIG. 1 illustrates a typical mobile station (also called a wireless telephone, cellular telephone or cell phone), shown generally at 10. The mobile station 10 includes an antenna 12 for sending and receiving radio signals between itself and a wireless network. The antenna 12 is connected to a transmitter/receiver circuit 14 to transmit radio signals to the wireless network and likewise respectively receive radio signals from the wireless network. A programmable control apparatus 16 controls and coordinates the functioning of the mobile station 10 responses to messages on a control channel using programs and data stored in a memory 18, so that the mobile station 10 can operate within the wireless network. The programmable control apparatus 16 also controls the operation of the mobile station 10 responsive to input from an input/output circuit 20. The input/output circuit 20 may be connected to a keypad as a user input device and a display to give the user information, as is conventional. In accordance with the invention, the input/output circuit 20 also controls an infrared (IR) photo emitter, such as an LED 22 for communicating with a removable battery pack 24, as described below. Alternatively, the device 22 may comprise a photo emitter/detector pair for transmitting and receiving through the air signals.

Figure 2:
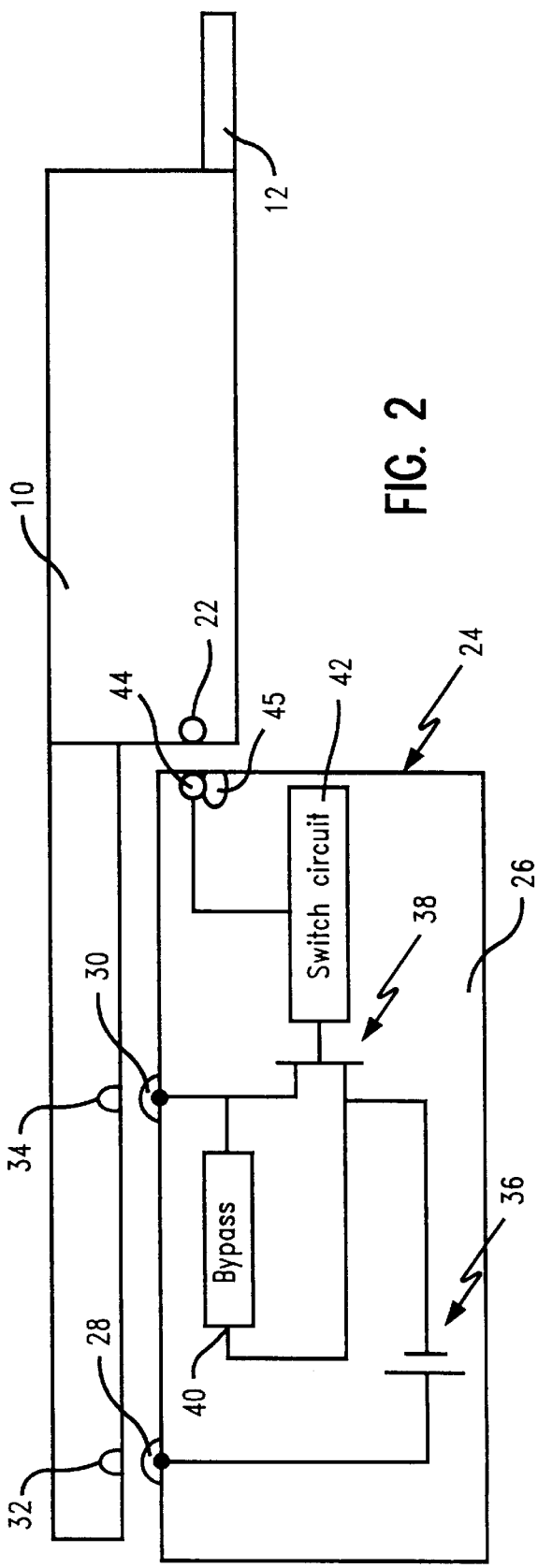
FIG. 2 illustrates a battery pack in proximity to a portable phone illustrating the battery in schematic form.

Referring also to FIG. 2, the battery pack 24 is illustrated in greater detail. The battery pack 24 includes a case 26 removably receivable on the mobile station 10, as is conventional. Battery terminals 28 and 30 are mounted to the case for mating with respective terminals 32 and 34 of the mobile station for supplying electrical power to the mobile station 10. A battery cell 36 is housed in the case. As is apparent, the case 26 may house numerous battery cells according to the configuration of the particular cells and the overall battery pack capacity, as necessary or desired.

The battery cell 36 is connected at one side to the positive terminal 28. Another side of the cell 36 is connected via a switch 38 to the negative terminal 30. As a result, when the switch 38 is open the battery cell 36 is effectively disconnected from the terminals 28 and 30 and the battery pack 24 is disabled. Conversely, when the switch 38 is closed, the battery cell 36 is connected to the terminals 28 and 30 so that the battery pack 24 is enabled to provide power to the mobile station 10. Likewise, the battery pack 24 could be connected to a separate charger device (not shown) via the terminals 28 and 30 for recharging the battery cell 36. In a charging circuit, the switch 38 would control connection of the battery cell 36 to the charger device.

In another embodiment, a bypass circuit 40 is connected across the switch 38. The bypass circuit 40 is a current limit device so that a small amount of current flows from the battery cell 36 even if the switch 38 is off. This can be used to power circuits in the mobile station 10, as might be necessary so the mobile station can power-up and control the switch 38.

Operation of the switch 38 is controlled with a switch circuit 42. The switch circuit 42 may comprise any known type of control circuit, such as a microcontroller or the like programmed to control operation of the battery pack 24 as required. In accordance with the invention, the switch circuit 42 is operatively connected to a photodetector 44 for receiving an IR signal from the photo emitter 22. Alternatively, the photodetector 44 could comprise part of a photo emitter/detector pair having a photo emitter 45 for bidirectional communication with a corresponding photo emitter/detector pair in the mobile station 10. As is apparent, the photodetector 44 can communicate with any type of external device configured to operate therewith, including, for example, a battery charger or the like. In its simplest form, the photodetector 44 receives a wireless control signal from a photo emitter, such as an infrared LED from an electrical or electronic device, such as the mobile station LED 22. The signal may be of a single, intermittent, periodic, or continuous form. The particular type of signal is not critical to the invention. Instead, the switch circuit 42 is configured according to the particular application to receive and analyze or decode appropriate type signals according to its design.

As examples, charging and discharging currents from or to the battery cell 36 can be regulated by controlling the switch 38 based on control signals received by the photodetector 44. This simplifies charger circuitry in the battery pack 24. The battery pack 24 could also be turned off or put in a limited power output mode, as might be desirable for a lithium ion battery, by opening the switch 38, so that excessive current draw is prevented when the battery pack 24 is removed from the mobile phone 10 or if a fault is detected in the phone or battery pack.

Figure 3:
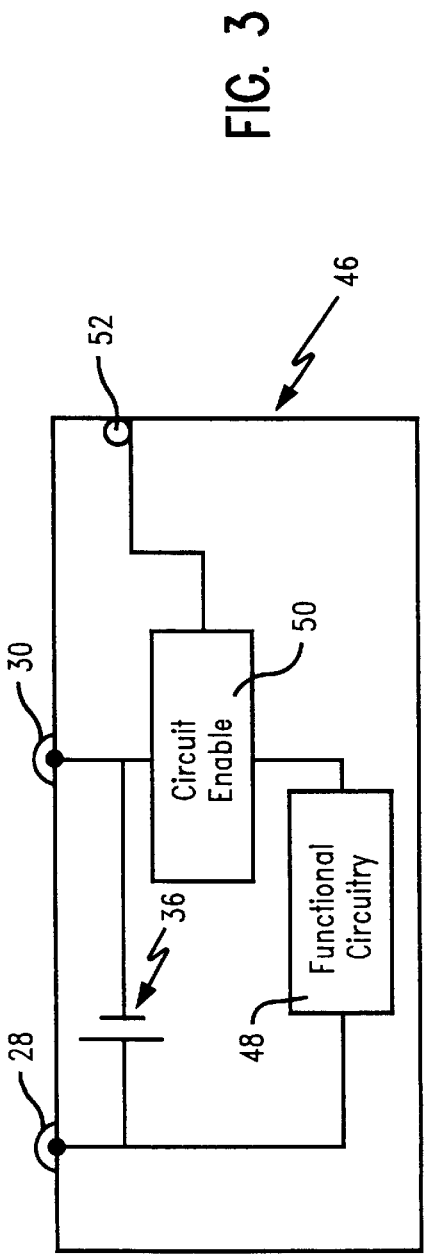
FIG. 3 illustrates a schematic of a battery according to an alternative embodiment of the invention.

Referring to FIG. 3, a battery pack 46 according to an alternative embodiment of the invention is illustrated. In this embodiment, like elements are illustrated with like reference numerals. The battery pack 46 connects the cell 36 directly to the terminals 28 and 30. A functional circuit block 48 is connected in series with a circuit enable circuit 50 across the cell 36. The circuit enable circuit 50 is operatively connected to a photo emitter/detector pair 52. The functional circuitry 48 may take various forms such as a vibrating element, a latching or locking element or a battery indicator. In this case the circuit enable circuit 50 receives and decodes commands from the photo emitter/detector pair 52 and controls operation of the functional circuitry 48 such as causing the battery indicator to illuminate or a vibrator to vibrate.

In accordance with either embodiment a photo emitter/detector pair 52 can be controlled to transmit a wireless signal using the photo emitter/detector pair 52 as an emitter to provide a separate infrared link. As such, the battery pack 24 or 46 could transmit information to provide its chemical type or size, or data about capacity, cycles state of charge or temperature to an external device, without being physically connected to such device.

Thus, in accordance with the invention, there is illustrated a battery pack with photo means for enabling integral circuitry.

I claim:

1. A battery pack for providing electrical power to an electrical or electronic device, comprising:

a case removably receivable on an electrical or electronic device;

a battery cell disposed in said case;

battery terminals mounted to said case and operatively connected to said cell for mating with corresponding terminals on the device;

a photodetector mounted to said case for receiving a wireless control signal;

a control circuit operatively connected to the photodetector and the battery cell for controlling operation of the battery pack responsive to the wireless control signal.

2. The battery pack of claim 1 further comprising a switch connected between the battery cells and the terminal for selectively connecting the cell to the terminals.

3. The battery pack of claim 2 wherein the control circuit controls operation of the switch to selectively enable or disable the battery pack.

4. The battery pack of claim 2 further comprising a bypass circuit connected across the switch providing an impedance in series with said cell.

5. The battery pack of claim 1 further comprising an operating element housed in the case and the control circuit controls operation of the operating element.

6. The battery pack of claim 5 wherein the operating element comprises an indicator light.

7. The battery pack of claim 5 wherein the operating element comprises a vibrator.

8. The battery pack of claim 5 wherein the operating element comprises a display displaying information about the battery pack.

9. The battery pack of claim 5 wherein the operating element comprises a photo emitter for transmitting a wireless signal regarding information about the battery pack.

10. The battery pack of claim 1 wherein the photodetector decodes the wireless control signal.

11. A battery pack for providing electrical power to an electrical or electronic device, comprising:

a case removably receivable on an electrical or electronic device;

a battery cell disposed in said case;

battery terminals mounted to said case and operatively connected to said cell for mating with corresponding terminals on the device, in use, to connect the cell to the device;

a photodetector mounted to said case for receiving a wireless control signal;

a photo emitter mounted to said case for transmitting a wireless signal regarding information about the battery pack; and a control circuit operatively connected to the photodetector, the photo emitter and the battery cell for controlling operation of the battery pack responsive to a received wireless control signal and controlling operation of the photo emitter.

12. The battery pack of claim 11 further comprising a switch connected between the battery cells and the terminal for selectively connecting the cell to the terminals.

13. The battery pack of claim 12 wherein the control circuit controls operation of the switch to selectively enable or disable the battery pack.

14. The battery pack of claim 12 further comprising a bypass circuit connected across the switch to supply a continuous low current level to the terminals.

15. The battery pack of claim 11 further comprising an operating element housed in the case and the control circuit controls operation of the operating element.

16. The battery pack of claim 15 wherein the operating element comprises an indicator light.

17. The battery pack of claim 15 wherein the operating element comprises a vibrator.

18. The battery pack of claim 15 wherein the operating element comprises a display displaying information about the battery pack.

19. The battery pack of claim 11 wherein the detector decodes the wireless control signal.

* * * * *